United States Patent
Wen et al.

(10) Patent No.: US 10,340,295 B2
(45) Date of Patent: Jul. 2, 2019

(54) FLEXIBLE DISPLAY DEVICE AND BORDER UNIT THEREOF

(71) Applicant: E Ink Holdings Inc., Hsinchu (TW)

(72) Inventors: Yi-Lung Wen, Hsinchu (TW);
Jia-Hung Chen, Hsinchu (TW);
Kuang-Heng Liang, Hsinchu (TW);
Chi-Ming Wu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/057,795

(22) Filed: Aug. 7, 2018

(65) Prior Publication Data

US 2019/0057984 A1   Feb. 21, 2019

(30) Foreign Application Priority Data

Aug. 15, 2017   (CN) .......................... 2017 1 0698153

(51) Int. Cl.
*H01L 23/48*   (2006.01)
*H01L 27/12*   (2006.01)

(52) U.S. Cl.
CPC ...... *H01L 27/1244* (2013.01); *H01L 27/1218* (2013.01); *H01L 27/1248* (2013.01)

(58) Field of Classification Search
None
See application file for complete search history.

(56) References Cited

U.S. PATENT DOCUMENTS

| | | | |
|---|---|---|---|
| 4,451,554 A | 5/1984 | Kishi et al. | |
| 5,796,121 A | 8/1998 | Gates | |
| 6,150,725 A * | 11/2000 | Misawa | H01L 23/3171 257/781 |
| 7,586,122 B2 | 9/2009 | You | |
| 7,786,497 B2 | 8/2010 | Cheng | |
| 8,178,878 B2 | 5/2012 | Chien et al. | |
| 8,431,970 B2 * | 4/2013 | Demircan | H01L 23/5223 257/232 |
| 9,057,905 B2 | 6/2015 | Liu et al. | |

(Continued)

FOREIGN PATENT DOCUMENTS

| | | |
|---|---|---|
| CN | 106782122 A | 5/2017 |
| CN | 106992263 A | 7/2017 |

(Continued)

OTHER PUBLICATIONS

Corresponding Taiwan Notice of Allowance dated Jul. 24, 2018.

*Primary Examiner* — Hung K Vu
(74) *Attorney, Agent, or Firm* — CKC & Partners Co., LLC

(57) ABSTRACT

A flexible display device includes a substrate and a border unit. The substrate has a display area and a border area that surrounds the display area. The border unit is located in the border area and includes a first metal layer on the substrate, an insulation layer covering the first metal layer and the substrate, a second metal layer on the insulation layer, a protection layer covering the second metal layer and the insulation layer, a semiconductor layer between the insulation layer and the protection layer, a planarization layer covering the protection layer, and a third metal layer on the planarization layer. The third metal layer has a first part, a second part, and a third part that is between and physically connected to the first and second parts. A notch is defined by the first, second, and third parts.

16 Claims, 4 Drawing Sheets

(56) References Cited

U.S. PATENT DOCUMENTS

| | | |
|---|---|---|
| 9,431,432 B2 | 8/2016 | Choi et al. |
| 9,450,038 B2 | 9/2016 | Kwon et al. |
| 2007/0004192 A1* | 1/2007 | Park .................. H01L 21/02126 438/622 |
| 2014/0346460 A1 | 11/2014 | Kang et al. |
| 2015/0179570 A1* | 6/2015 | Marimuthu ......... H01L 25/0652 257/774 |
| 2016/0268319 A1 | 9/2016 | Long et al. |

FOREIGN PATENT DOCUMENTS

| | | |
|---|---|---|
| KR | 20150001019 A | 1/2015 |
| TW | 201033958 A | 9/2010 |
| TW | I463235 B | 12/2014 |

\* cited by examiner

FLEXIBLE DISPLAY DEVICE AND BORDER UNIT THEREOF

RELATED APPLICATIONS

This application claims priority to China Application Serial Number 201710698153.1, Aug. 15, 2017, which is herein incorporated by reference.

BACKGROUND

Field of Invention

The present invention relates to a flexible display device and a border unit of the flexible display device.

Description of Related Art

Since flexible display panels (e.g., electrophoretic display panels and organic light emitting diode panels) have been presented to the public, foldable display devices have appeared in the market of electronic products nowadays. Generally, a display device has a display area and a border area. The display area has plural pixel units, and the border area has conductive lines electrically connected to the pixel units, and the conductive lines of the border area may be electrically connected to other electronic elements (e.g., a flexible printed circuit board).

Because the conductive lines of the border area are not specifically designed, metal layers used as the conductive lines are considered as a continuous layout. Therefore, when the flexible display device is bent by a force, the force is continuously transmitted through the metal layers, and hence the force cannot be relaxed. As a result, stress concentration is formed in the metal layers, thus very likely causing continuous damages to the meal layer due to the force exerted thereon, and reducing the lifespan of the display device.

SUMMARY

An aspect of the present invention is to provide a flexible display device.

According to an embodiment of the present invention, a flexible display device includes a substrate and a border unit. The substrate has a display area and a border area that surrounds the display area. The border unit is located in the border area and includes a first metal layer, an insulation layer, a second metal layer, a protection layer, a semiconductor layer, a planarization layer, and a third metal layer. The first metal layer is located on the substrate. The insulation layer covers the first metal layer and the substrate. The second metal layer is located on the insulation layer. The protection layer covers the second metal layer and the insulation layer. The semiconductor layer is located between the insulation layer and the protection layer. The planarization layer covers the protection layer. The third metal layer is located on the planarization layer and has a first part, a second part, and a third part. The third part is located between the first part and the second part and is physically connected to the first part and the second part, such that a notch is defined by the first part, the second part, and the third part.

In one embodiment of the present invention, a combination of the first part, the second part, and the third part is substantially U-shaped.

In one embodiment of the present invention, the first part is substantially parallel to the second part.

In one embodiment of the present invention, the third part is substantially perpendicular to the first part and the second part.

In one embodiment of the present invention, the notch faces the display area.

In one embodiment of the present invention, the notch faces away from the display area.

In one embodiment of the present invention, an obtuse angle is formed between a sidewall of the third metal layer facing the notch and the planarization layer.

In one embodiment of the present invention, the planarization layer has a groove, and the groove corresponds to the notch in position, thereby enabling the groove to communicate with the notch.

In one embodiment of the present invention, a portion of the protection layer is exposed through the groove and the notch.

In one embodiment of the present invention, the planarization layer has a sidewall that faces the groove, and the third metal layer is located on the sidewall and the portion of the protection layer.

In one embodiment of the present invention, an obtuse angle is formed between the sidewall of the planarization layer and the protection layer.

In one embodiment of the present invention, an obtuse angle is formed between the third metal layer that is on the sidewall and the third metal layer that is on the portion of the protection layer.

In one embodiment of the present invention, the planarization layer has a surface that faces away from the protection layer, and the third metal layer is located on the surface, and an obtuse angle is formed between the third metal layer that is located on the surface and the third metal layer that is located on the sidewall.

In one embodiment of the present invention, the third metal layer has a plurality of first parts, a plurality of second parts, and a plurality of third parts, and the third metal layer is substantially wave-shaped.

In one embodiment of the present invention, a plurality of notches are defined by the first parts, the second parts, and the third parts, and a portion of the notches face the display area, and the other portion of the notches face away from the display area, and the portion of the notches facing the display area and the other portion of the notches facing away from the display area are alternately arranged.

An aspect of the present invention is to provide a border unit located in a border area of a substrate.

According to an embodiment of the present invention, a border unit includes a first metal layer, an insulation layer, a second metal layer, a protection layer, a semiconductor layer, a planarization layer, and a third metal layer. The first metal layer is located on the substrate. The insulation layer covers the first metal layer and the substrate. The second metal layer is located on the insulation layer. The protection layer covers the second metal layer and the insulation layer. The semiconductor layer is located between the insulation layer and the protection layer. The planarization layer covers the protection layer. The third metal layer is located on the planarization layer and has a first part, a second part, and a third part. The third part is located between the first part and the second part and is physically connected to the first part and the second part, such that a notch is defined by the first part, the second part, and the third part.

In the aforementioned embodiments of the present invention, because the third metal layer has the first part, the second part, and the third part, and the notch is defined by the first part, the second part, and the third part, the third metal layer located on the planarization layer may be considered as a discontinuous layout, and has a bending shape. As a result, when the flexible display device is bent by a force, the notch of the third metal layer can prevent stress concentration and can avoid causing continuous damages after the third metal layer receives the force, thereby extending the lifespan of the flexible display device.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
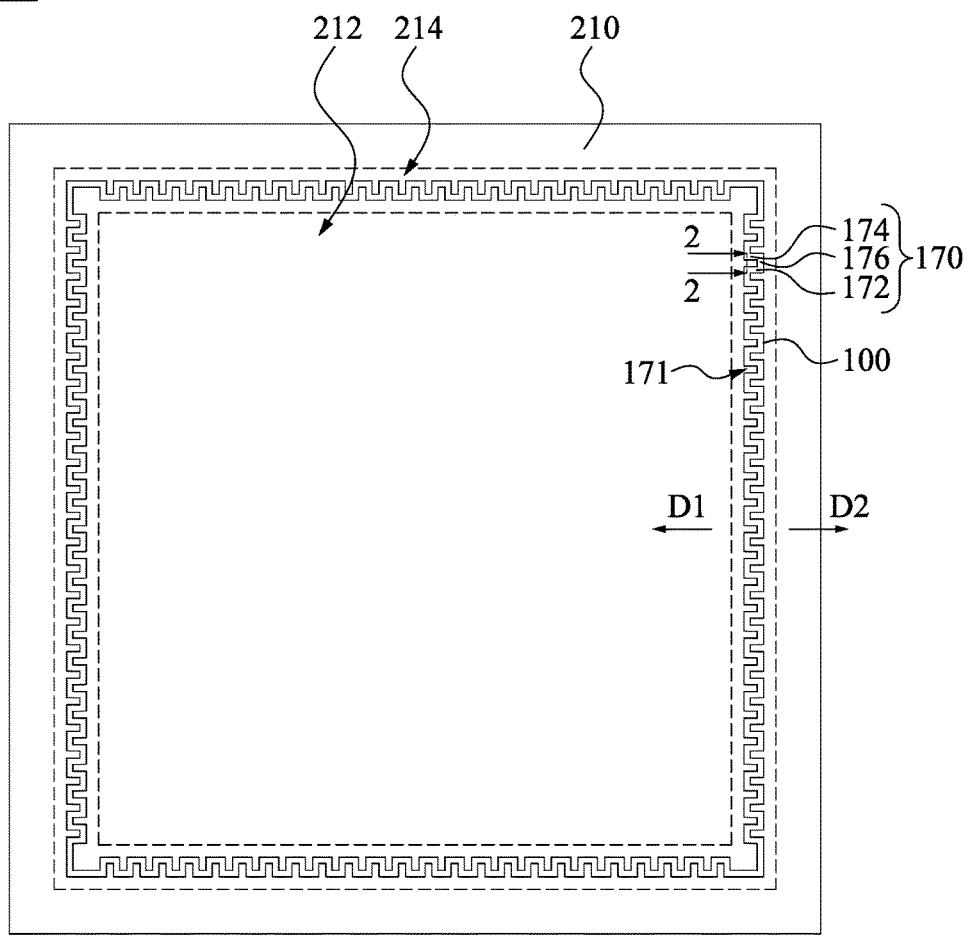
FIG. 1 is a top view of a flexible display device according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a top view of a flexible display device 200 according to one embodiment of the present invention. As shown in FIG. 1, the flexible display device 200 includes a substrate 210 and a border unit 100. The substrate 210 has a display area 212 and a border area 214 that surrounds the display area 212. The border unit 100 is located in the border area 214. The border unit 100 has a metal layer that is used as a conductive line for electrically connecting pixel units of the display area 212 and other electronic element, such as a flexible printed circuit board (FPC) or an integrated circuit (IC).

Figure 2:
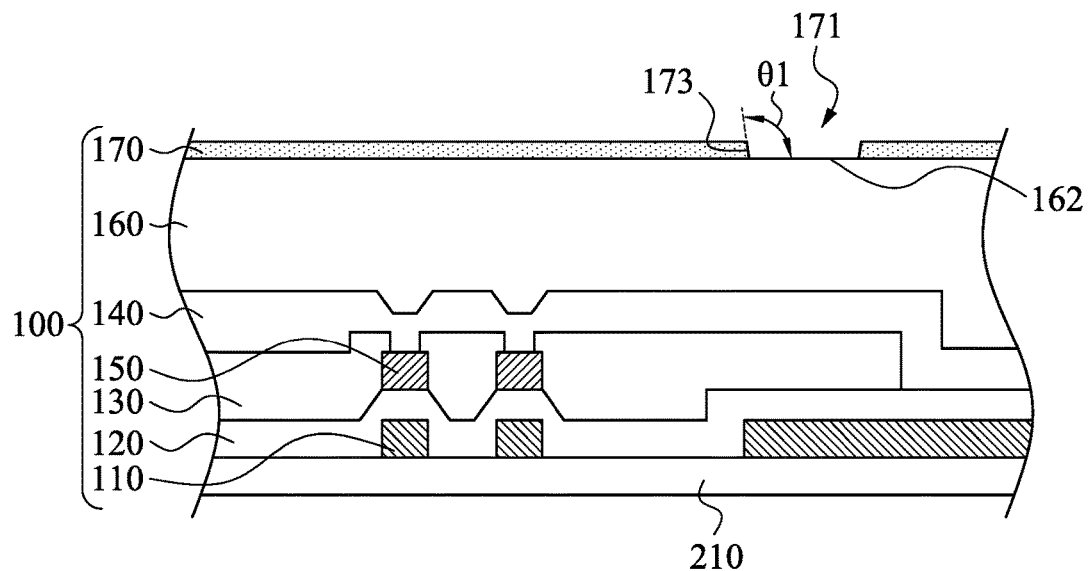
FIG. 2 is a cross-sectional view of a border unit taken along line 2-2 shown in FIG. 1.

FIG. 2 is a cross-sectional view of the border unit 100 taken along line 2-2 shown in FIG. 1. As shown in FIG. 1 and FIG. 2, the border unit 100 includes a first metal layer 110, an insulation layer 120, a second metal layer 130, a protection layer 140, a semiconductor layer 150, a planarization layer 160, and a third metal layer 170. The first metal layer 110 is located on the substrate 210. The insulation layer 120 covers the first metal layer 110 and the substrate 210. The second metal layer 130 is located on the insulation layer 120. The protection layer 140 covers the second metal layer 130 and the insulation layer 120. The semiconductor layer 150 is located between the insulation layer 120 and the protection layer 140. The planarization layer 160 covers the protection layer 140. The third metal layer 170 is located on the planarization layer 160 and has a first part 172, a second part 174, and a third part 176. The third part 176 is located between the first part 172 and the second part 174 and is physically connected to the first part 172 and the second part 174 (may also see FIG. 3), such that a notch 171 is defined by the first part 172, the second part 174, and the third part 176.

Since the third metal layer 170 of the border unit 100 has the first part 172, the second part 174, and the third part 176, and the notch 171 is defined by the first part 172, the second part 174, and the third part 176, the third metal layer 170 located on the planarization layer 160 may be considered as a discontinuous layout, and has a bending shape. As a result, when the flexible display device 200 is bent by a force, the notch 171 of the third metal layer 170 prevents stress concentration and avoids causing continuous damages after the third metal layer 170 receives the force, thereby extending the lifespan of the flexible display device 200.

In this embodiment, a combination of the first part 172, the second part 174, and the third part 176 of the third metal layer 170 is substantially U-shaped when viewed from above. In other words, two ends of the third part 176 respectively adjoin an end of the first part 172 and an end of the second part 174. In this embodiment, the first part 172 may be substantially parallel to the second part 174, and the third part 176 may be substantially perpendicular to the first part 172 and the second part 174, but the present invention is not limited in this regard.

In addition, the notch 171 may face the display area 212 or may face away from the display area 212. For example, the notch 171 having an opening direction D1 faces the display area 212, and the notch 171 having an opening direction D2 faces away from the display area 212. If the third metal layer 170 has plural first parts 172, plural second parts 174, and plural third parts 176, and is formed by the first parts 172, the second parts 174 and the third parts 176 that are connected, the third metal layer 170 may be substantially wave-shaped when viewed from above. As a result, a portion of the notches 171 face the display area 212, and the other portion of the notches 171 face away from the display area 212, and the notches 171 facing the display area 212 and the notches 171 facing away from the display area 212 are alternately arranged. In another embodiment, the first part 172 and the second part 174 of the third metal layer 170 may not be parallel with each other. In other words, a combination of the first parts 172, the second parts 174, and the third parts 176 of the third metal layer 170 is substantially in a zig-zag form when viewed from above.

Figure 3:
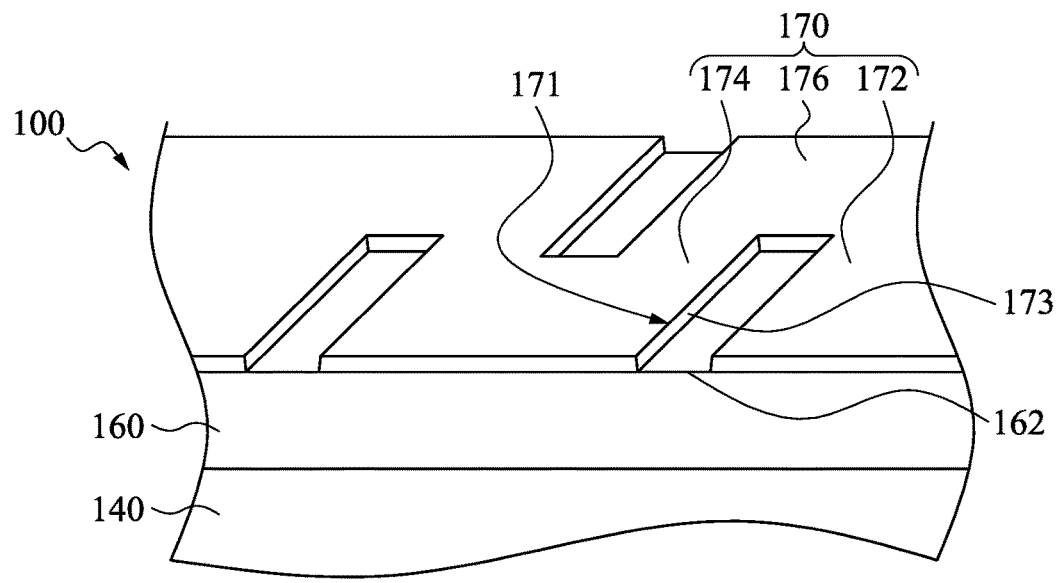
FIG. 3 is a partially cross-sectional perspective view of the border unit shown in FIG. 2.

FIG. 3 is a partially cross-sectional perspective view of the border unit 100 shown in FIG. 2. As shown in FIG. 2 and FIG. 3, a patterning process may be performed on the third metal layer 170 to form the notch 171. For example, the patterning process may include exposure, development, and etching processes. After the third metal layer 170 is patterned, a surface 162 of the planarization layer 160 may be exposed through the notch 171, and a sidewall 173 of the third metal layer 170 facing the notch 171 may be an oblique surface. As a result, an obtuse angle θ1 may be formed between the sidewall 173 of the third metal layer 170 and the surface 162 of the planarization layer 160. The obtuse angle θ1 may further prevent the third metal layer 170 from undergoing continuous damages after the third metal layer 170 receives a force.

It is to be noted that the connection relationships and the advantages of the elements described above will not be repeated hereinafter. In the following description, other border units will be described.

Figure 4:
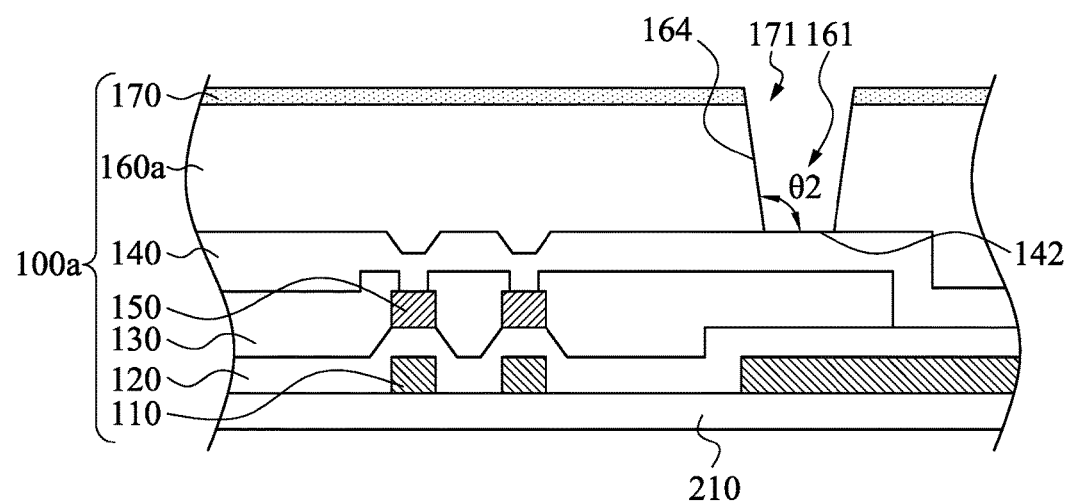
FIG. 4 is a cross-sectional view of a border unit according to one embodiment of the present invention.
Figure 5:
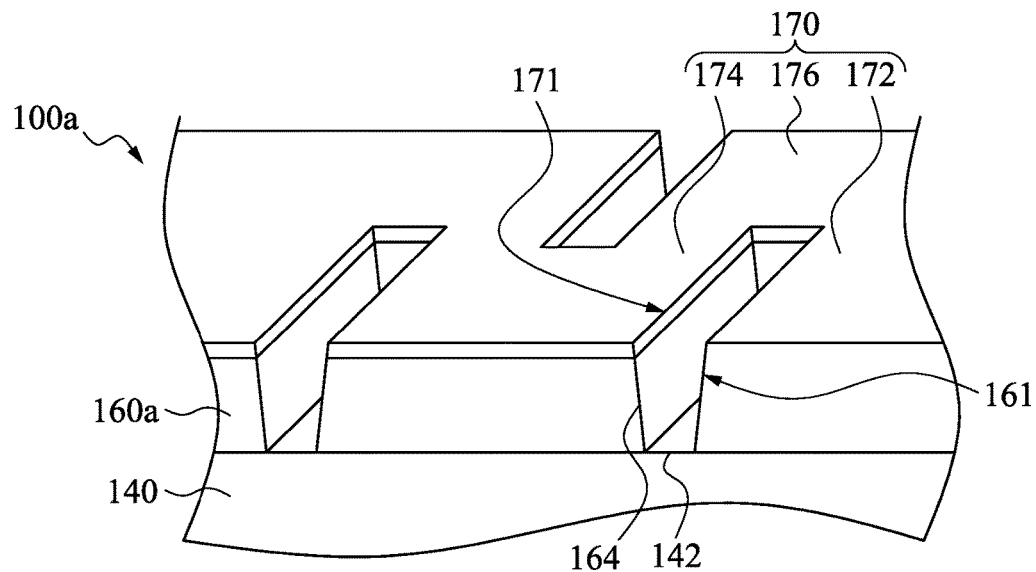
FIG. 5 is a partially cross-sectional perspective view of the border unit shown in FIG. 4.

FIG. 4 is a cross-sectional view of a border unit 100a according to one embodiment of the present invention. FIG. 5 is a partially cross-sectional perspective view of the border unit 100a shown in FIG. 4. As shown in FIG. 4 and FIG. 5, the border unit 100a includes the first metal layer 110, the insulation layer 120, the second metal layer 130, the protection layer 140, the semiconductor layer 150, a planarization layer 160a, and the third metal layer 170. The difference between this embodiment and the embodiment shown in FIGS. 2 and 3 is that the planarization layer 160a further has a groove 161, and a position of the groove 161 corresponds to a position of the notch 171 of the third metal layer 170. As a result, the groove 161 may communicate with the notch 171, and a portion of the protection layer 140 (e.g., a surface 142 of the protection layer 140) may be exposed through the groove 161 and the notch 171.

Moreover, the planarization layer 160a has a sidewall 164 that faces the groove 161. A patterning process may be performed on the planarization layer 160a to form the groove 161. After the planarization layer 160a is patterned, the surface 142 of the protection layer 140 may be exposed through the notch 171 and the groove 161, and the sidewall 164 of the planarization layer 160a facing the groove 161 may be an oblique surface. In this embodiment, an obtuse angle θ2 is formed between the sidewall 164 of the planarization layer 160a and the protection layer 140 that is in the groove 161. The obtuse angle θ2 may further prevent the third metal layer 170 from undergoing continuous damages after the third metal layer 170 receives a force.

Figure 6:
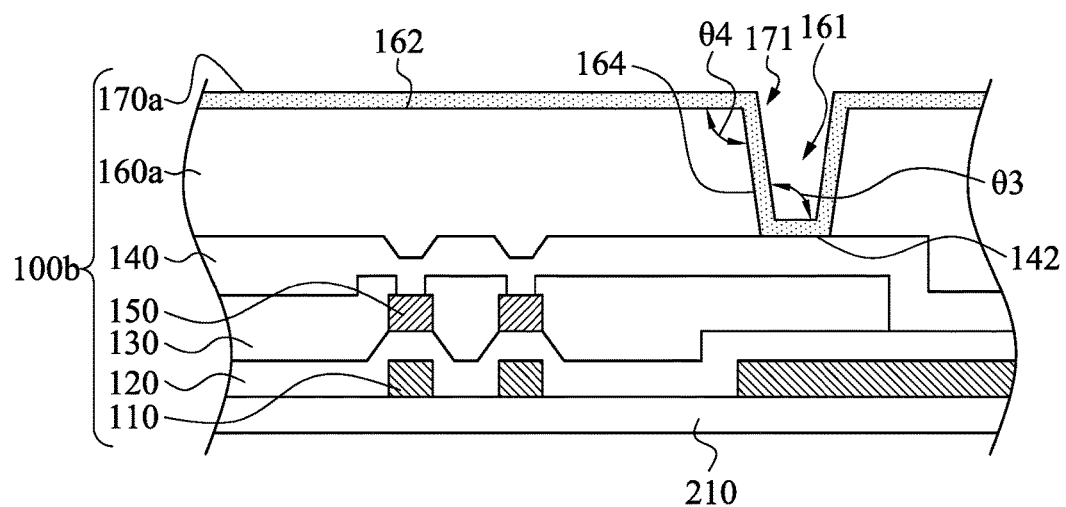
FIG. 6 is a cross-sectional view of a border unit according to one embodiment of the present invention.
Figure 7:
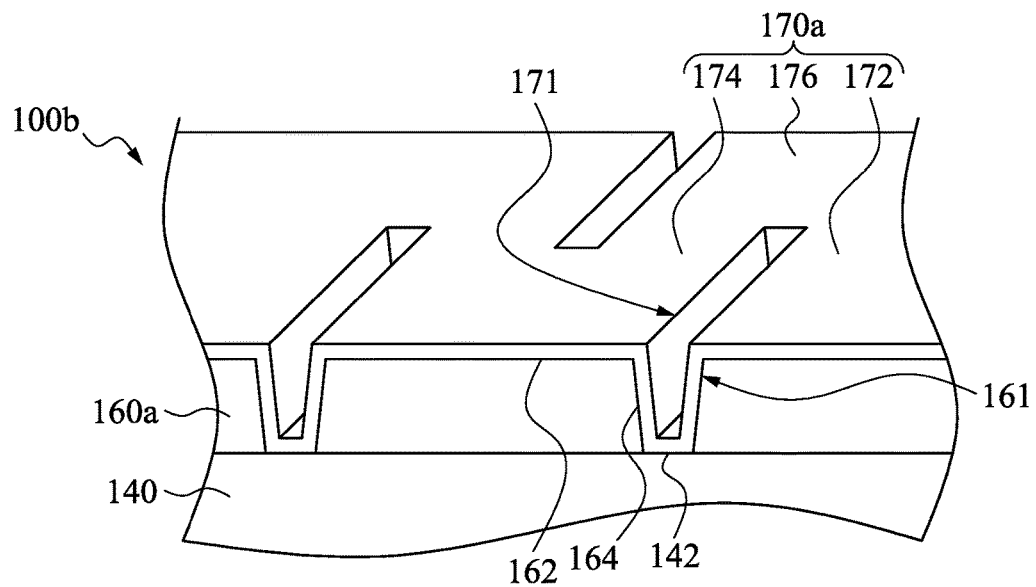
FIG. 7 is a partially cross-sectional perspective view of the border unit shown in FIG. 6.

FIG. 6 is a cross-sectional view of a border unit 100b according to one embodiment of the present invention. FIG. 7 is a partially cross-sectional perspective view of the border unit 100b shown in FIG. 6. As shown in FIG. 6 and FIG. 7, the border unit 100b includes the first metal layer 110, the insulation layer 120, the second metal layer 130, the protection layer 140, the semiconductor layer 150, the planarization layer 160a, and a third metal layer 170a. The difference between this embodiment and the embodiment shown in FIGS. 4 and 5 is that the third metal layer 170a extends into the groove 161 of the planarization layer 160a, and the third metal layer 170a is located on the sidewall 164 of the planarization layer 160a and the surface 142 of the protection layer 140 that is in the groove 161. In addition, an obtuse angle θ3 is formed between the third metal layer 170a that is on the sidewall 164 of the planarization layer 160a and the third metal layer 170a that is on the surface 142 of the protection layer 140. The obtuse angle θ3 may further prevent the third metal layer 170a from undergoing continuous damages after the third metal layer 170 receives a force.

In this embodiment, the planarization layer 160a has the surface 162 that faces away from the protection layer 140. The third metal layer 170a is located on the surface 162 of the planarization layer 160a, and an obtuse angle θ4 is formed between the third metal layer 170a that is on the surface 162 of the planarization layer 160a and the third metal layer 170a that is on the sidewall 164 of the planarization layer 160a. The obtuse angle θ4 may further prevent the third metal layer 170a from undergoing continuous damages after the third metal layer 170a receives a force.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A flexible display device, comprising:
   a substrate having a display area and a border area that surrounds the display area; and
   a border unit located in the border area, and the border unit comprising:
     a first metal layer located on the substrate;
     an insulation layer covering the first metal layer and the substrate;
     a second metal layer located on the insulation layer;
     a protection layer covering the second metal layer and the insulation layer;
     a semiconductor layer located between the insulation layer and the protection layer;
     a planarization layer covering the protection layer; and
     a third metal layer located on the planarization layer and having a first part, a second part, and a third part, wherein the third part is located between the first part and the second part, and is physically connected to the first part and the second part, such that a notch is defined by the first part, the second part, and the third part.

2. The flexible display device of claim 1, wherein a combination of the first part, the second part, and the third part is substantially U-shaped.

3. The flexible display device of claim 1, wherein the first part is substantially parallel to the second part.

4. The flexible display device of claim 1, wherein the third part is substantially perpendicular to the first part and the second part.

5. The flexible display device of claim 1, wherein the notch faces the display area.

6. The flexible display device of claim 1, wherein the notch faces away from the display area.

7. The flexible display device of claim 1, wherein an obtuse angle is formed between a sidewall of the third metal layer facing the notch and the planarization layer.

8. The flexible display device of claim 1, wherein the planarization layer has a groove, and the groove corresponds to the notch in position, thereby enabling the groove to communicate with the notch.

9. The flexible display device of claim 8, wherein a portion of the protection layer is exposed through the groove and the notch.

10. The flexible display device of claim 9, wherein the planarization layer has a sidewall that faces the groove, and the third metal layer is located on the sidewall and the portion of the protection layer.

11. The flexible display device of claim 10, wherein an obtuse angle is formed between the sidewall of the planarization layer and the protection layer.

12. The flexible display device of claim 10, wherein an obtuse angle is formed between the third metal layer that is located on the sidewall and the third metal layer that is located on the portion of the protection layer.

13. The flexible display device of claim 10, wherein the planarization layer has a surface that faces away from the protection layer, and the third metal layer is located on the surface, and an obtuse angle is formed between the third metal layer that is located on the surface and the third metal layer that is located on the sidewall.

14. The flexible display device of claim 1, wherein the third metal layer has a plurality of first parts, a plurality of second parts, and a plurality of third parts, and the third metal layer is substantially wave-shaped.

15. The flexible display device of claim 14, wherein a plurality of notches are defined by the first parts, the second parts, and the third parts, and a portion of the notches face the display area, and the other portion of the notches face away from the display area, and the portion of the notches facing the display area and the other portion of the notches facing away from the display area are alternately arranged.

16. A border unit located in a border area of a substrate, the border unit comprising:
- a first metal layer located on the substrate;
- an insulation layer covering the first metal layer and the substrate;
- a second metal layer located on the insulation layer;
- a protection layer covering the second metal layer and the insulation layer;
- a semiconductor layer located between the insulation layer and the protection layer;
- a planarization layer covering the protection layer; and
- a third metal layer located on the planarization layer and having a first part, a second part, and a third part, wherein the third part is located between the first part and the second part and is physically connected to the first part and the second part, such that a notch is defined by the first part, the second part, and the third part.

* * * * *